(12) United States Patent
Rateick, Jr. et al.

(10) Patent No.: US 10,119,585 B2
(45) Date of Patent: Nov. 6, 2018

(54) CARBON-CARBON COMPOSITE INCLUDING HYDROPHOBIC COATING

(71) Applicant: Honeywell International Inc., Morris Plains, NJ (US)

(72) Inventors: Richard George Rateick, Jr., South Bend, IN (US); Stephen Frederic Yates, South Barrington, IL (US)

(73) Assignee: Honeywell International Inc., Morris Plains, NJ (US)

( * ) Notice: Subject to any disclaimer, the term of this patent is extended or adjusted under 35 U.S.C. 154(b) by 146 days.

(21) Appl. No.: 14/990,564

(22) Filed: Jan. 7, 2016

(65) Prior Publication Data

US 2017/0198775 A1    Jul. 13, 2017

(51) Int. Cl.
*F16D 65/12* (2006.01)
*C23C 16/26* (2006.01)
(Continued)

(52) U.S. Cl.
CPC .......... *F16D 65/126* (2013.01); *C04B 41/009* (2013.01); *C04B 41/52* (2013.01); *C04B 41/89* (2013.01); *C23C 16/045* (2013.01); *C23C 16/26* (2013.01); *F16D 69/023* (2013.01); *C04B 2111/00362* (2013.01); *C04B 2111/27* (2013.01); *F16D 2200/0052* (2013.01); *F16D 2200/0082* (2013.01); *F16D 2250/0046* (2013.01)

(58) Field of Classification Search
CPC .............. F16D 65/126; F16D 69/023; F16D 2250/0046; C04B 35/71
See application file for complete search history.

(56) References Cited

U.S. PATENT DOCUMENTS 6,537,470 B1   3/2003  Wood et al.
7,172,408 B2   2/2007  Wood et al.
(Continued)

FOREIGN PATENT DOCUMENTS

CN   102503585 B   7/2013
WO   2007015026 A2  2/2007
WO   2015049291 A1  4/2015

OTHER PUBLICATIONS

Extended Search Report from counterpart European Application No. 16204552.0, dated May 23, 2017, 7 pp.
(Continued)

*Primary Examiner* — Hai Vo
(74) *Attorney, Agent, or Firm* — Shumaker & Sieffert, P.A.

(57) ABSTRACT

In some examples, an article may include a carbon-carbon composite, an antioxidant in pores in a surface of the carbon-carbon composite, and a hydrophobic coating on the surface. The hydrophobic coating includes an oxide of a metal. The metal has a Pauling electronegativity of less than about 1.7. In some examples, the article may be a carbon-carbon composite brake disk that includes a carbon-carbon composite substrate defining a friction surface and a non-friction surface. The antioxidant may be a phosphate-based antioxidant, and the antioxidant may be in pores in the non-friction surface. In some examples, the hydrophobic coating is on the non-friction surface over the phosphate-based antioxidant. In some examples, the hydrophobic coating may include a majority of at least one of yttrium oxide, scandium oxide, or zirconium oxide.

14 Claims, 2 Drawing Sheets

(51) Int. Cl.
    *C23C 16/04*      (2006.01)
    *F16D 69/02*      (2006.01)
    *C04B 41/89*      (2006.01)
    *C04B 41/00*      (2006.01)
    *C04B 41/52*      (2006.01)
    *C04B 111/00*      (2006.01)
    *C04B 111/27*      (2006.01)

(56) References Cited

U.S. PATENT DOCUMENTS

| | | |
|---|---|---|
| 2002/0096407 A1 | 7/2002 | Gray |
| 2003/0138672 A1 | 7/2003 | Bauer et al. |
| 2004/0020728 A1 | 2/2004 | Koucouthakis et al. |
| 2007/0026153 A1 | 2/2007 | Nicolaus et al. |
| 2007/0154712 A1 | 7/2007 | Mazany et al. |
| 2008/0311301 A1 | 12/2008 | Diss et al. |
| 2013/0251942 A1 | 9/2013 | Azimi et al. |

OTHER PUBLICATIONS

Bao et al., "Facile preparation of superhydrophobic surfaces based on metal oxide nanoparticles," Applied Surface Science, vol. 303, Mar. 11, 2014, pp. 473-480.

Chandler, "Rare earth oxides make water-repellent surfaces that last," MIT Energy Initiative, Massachusetts Institute of Technology, Jan. 22, 2013, 3 pp.

Kaptay et al., "On Different Modifications of the Capillary Model of Penetration of Inert Liquid Metals into Porous Refractories and their Connection to the Pore Size Distribution of the Refeactories," Metallurgical and Materials Transactions B, vol. 35B, Jun. 2004, pp. 471-486.

Li et al., "Selective Oxidation of Carbon Using Iron-Modified Cerium Oxide," J. Phys. Chem. C., vol. 113, Aug. 5, 2009, pp. 15288-15297.

Yoshida et al., "Preparation of Hydrophobic Metal Oxide Films," Journal of the Society of Inorganic Materials, vol. 20, May 20, 2013, pp. 275-281.

Azimi et al., "Hydrophobicity of rare-earth oxide ceramics," Nature Materials, vol. 12, Letters, Jan. 20, 2013, pp. 315-320.

Gupta et al., "Oxide reduction processes in the preparation of rare-earth metals," Special Rare-Earth Minerals Issue, Minerals & Metallurgical Processing, vol. 30, No. 1, Feb. 2013, pp. 38-44.

Tunusoglu et al., "Surfactant-assisted formation of organophilic $CeO_2$ nanoparticles," Colloids and Surfaces A: Physicochemical and Engineering Aspects, vol. 395, Dec. 16, 2011, pp. 10-17.

Response to Extended Search Report dated May 23, 2017, from counterpart European Application No. 16204552.0, filed Sep. 11, 2017, 36 pp.

Examination Report from counterpart European Application No. 16204552.0, dated Aug. 28, 2018, 4 pp.

CARBON-CARBON COMPOSITE INCLUDING HYDROPHOBIC COATING

TECHNICAL FIELD

The disclosure relates to carbon-carbon composite materials, such as aircraft brake discs made of carbon-carbon composite materials.

BACKGROUND

Carbon-carbon (C—C) composites can be used in many high temperature applications. For example, the aerospace industry employs C—C composite components as friction materials for commercial and military aircraft, such as brake friction materials. In some examples, C—C friction materials may include a phosphate-based antioxidant infused into an outer surface of the C—C friction materials to reduce oxidation of the C—C friction material upon exposure to urea-based runway deicers.

SUMMARY

In some examples, an article includes a carbon-carbon composite, an antioxidant in pores in a surface of the carbon-carbon composite, and a hydrophobic coating on the surface. The hydrophobic coating includes an oxide of a metal. The metal has a Pauling electronegativity of less than about 1.7.

In some examples, a method includes infiltrating a phosphate-based antioxidant into pores in a surface of a carbon-carbon composite and forming a hydrophobic coating on the surface of the carbon-carbon composite. The hydrophobic coating includes an oxide of a metal. The metal has a Pauling electronegativity of less than about 1.7.

In some examples, a carbon-carbon composite brake disc includes a carbon-carbon composite substrate defining a friction surface and a non-friction surface, a phosphate-based antioxidant in pores in the non-friction surface, and a hydrophobic coating on the non-friction surface over the phosphate-based antioxidant. The hydrophobic coating includes a majority of at least one of yttrium oxide, scandium oxide, or zirconium oxide.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
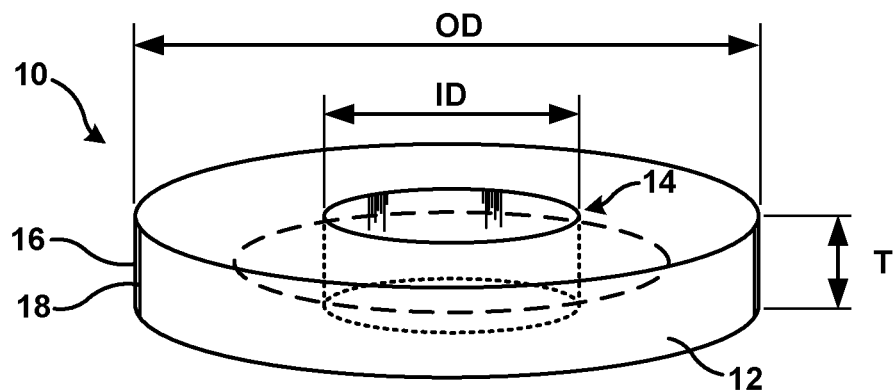
FIG. 1 is a perspective view of an example carbon-carbon composite that includes a hydrophobic coating including at least one metal oxide.

The present disclosure describes carbon-carbon composite materials including a hydrophobic coating including at least one metal oxide. The at least one metal oxide may include an oxide of a metal having a Pauling electronegativity of less than about 1.7. Because the metal has a Pauling electronegativity of less than about 1.7, the metal oxide may be hydrophobic. Thus, the hydrophobic coating including the metal oxide may be hydrophobic. As used herein, a coating is hydrophobic if it exhibits a contact angle with water of between 90 degrees and 180 degrees. The hydrophobic coating increases the contact angle with water compared to a carbon-carbon composite material that includes a phosphate-based antioxidant infused into an outer surface of the C—C composite material.

In some examples, the carbon-carbon composite material additionally may include an antioxidant in pores of the surface on which the hydrophobic coating is formed. The antioxidant can be, for example, a phosphate-based antioxidant. In some examples, the phosphate-based antioxidant may provide resistance to thermal oxidation to the carbon-carbon composite material. For example, the phosphate-based antioxidant may poison active lattice sites on the carbon lattice to reduce reactivity of the poisoned lattice sites with oxidants. As another example, the phosphate-based antioxidant may partially block pores in the carbon, which may reduce gas transport of oxidants into the carbon-carbon composite material. However, the phosphate-based antioxidant material may by hygroscopic, and encourage absorption of water by the carbon-carbon composite material in instances in which the carbon-carbon composite material does not include the hydrophobic coating. The hydrophobic coating described herein may reduce absorption of water and water-based solutions by the carbon-carbon composite material.

Some runway deicers used at airports may include alkali metal or alkaline earth carboxylate salts (e.g., potassium or calcium formate or acetate). As part of the deicing procedure, the deicers may be mixed in a water-based solution, or may form a water-based solution when melting ice or snow. In the absence of the hydrophobic coatings described herein, carbon-carbon composite materials used in aircraft, such as carbon-carbon composite brake discs, may absorb the waterborne alkali metal or alkaline earth carboxylate salts. The alkali metal or alkaline earth carboxylate salts may catalyze oxidation of the carbon-carbon composite. The phosphate-based antioxidants may not provide sufficient protection against such catalytic oxidation. The catalytic oxidation may have adverse impacts on the carbon-carbon composite, such as by reducing the useful life of a component formed from the carbon-carbon composite. By reducing or substantially eliminating absorption of water and water-based solutions including alkali metal or alkaline earth carboxylate salts, the hydrophobic coating described herein may protect carbon-carbon composite materials from catalytic oxidation due to alkali metal or alkaline earth carboxylate salts, among other advantages. Additionally, when used in a carbon-carbon composite brake disc, the hydrophobic coating may result in droplets of deicer laden water forming on an outer circumferential surface of the brake disc, rather than a film of deicer laden water. When the brake disc spins upon spinning of the wheel, droplets will fling off of the outer circumferential surface of the brake disc more easily than a spread out film on a hydrophilic surface. In this way, the hydrophobic coating may result in a greater chance that the droplets of deicer laden water are removed from the brake disc before soaking into the disc.

FIG. 1 is a perspective view of an example carbon-carbon composite 10 that may include a hydrophobic coating including at least one metal oxide. Carbon-carbon composite 10 includes a carbon-carbon composite substrate 12 and a hydrophobic coating 18 including at least one metal oxide on at least one surface of carbon-carbon composite substrate 12. In the example of FIG. 1, carbon-carbon composite 10 includes hydrophobic coating 18 on outer circumferential surface 16.

Carbon-carbon composite 10 may include carbon-based reinforcement fibers and a carbon-based matrix material at least partially surrounding the carbon-based reinforcement fibers. In some examples, carbon-carbon composite 10 may be formed form a porous preform that includes carbon fibers or carbon-precursor fibers. Examples of porous preforms that may be used to produce carbon-carbon composite 10 include, but are not limited to: a fibrous preform, such as a woven fiber preform, a nonwoven fiber preform, a chopped-fiber and binder preform, a binder-treated random fiber preform, a carbon fiber preform, or a ceramic fiber preform; a foam preform; a porous carbon body preform; or a porous ceramic body preforms. In some examples, the porous preform includes a plurality of mechanically bound layers, which can be, for example, a plurality of fibrous layers, such as a plurality of woven or nonwoven fabric layers, connected together, e.g., bound by a binder, such as a resin binder, or via needle-punching of the plurality of layers. In some examples, the layers include one or more tow layers, one or more web layers, or combinations thereof. Tow layers may include one or more tows of fibers. Tows of fibers may be arranged in any suitable arrangement including, for example, linear, radial, chordal, or the like. Web layers may include web fibers, which may include relatively short, chopped, and entangled fibers of fibers.

In other examples, the porous preform may not include predefined layers, but, rather, may be formed from a bundle of fibers that are mechanically bound together, e.g., via needling. In other examples, a combination of any of the aforementioned types of porous preforms can be used.

In some examples, the porous preform may be formed using carbon fibers. In other examples, the porous preform may be formed using a carbon fiber precursor material, such as polyacrylonitrile (PAN) fibers, which are subsequently pyrolyzed to form carbon fibers. In some examples, the porous preform may include isotropic carbon or a precursor material that converts to isotropic carbon when pyrolyzed. For example, PAN may convert to isotropic carbon when pyrolyzed.

Carbon-carbon composite 10 also may include a matrix material that at least partially encapsulates the carbon fibers. The matrix material may be introduced into the porous preform using one or more of a variety of techniques, including, for example, chemical vapor deposition/chemical vapor infiltration (CVD/CVI), resin transfer molding (RTM), vacuum/pressure infiltration (VPI), high pressure impregnation/carbonization (PIC), or the like. Examples of densifying agents that may be used in an RTM, VPI, or PIC process include, but are not limited to, liquid resin or pitches (e.g., isotropic and/or mesophase pitches) that provide a relatively high carbon yield, e.g., of greater than about 80%, and may have a relatively high viscosity, such as synthetic mesophase pitches, coal-tar derived pitches, such as thermally or chemically treated coal tar, petroleum-derived pitches, synthetic-pitch derivatives, thermally treated pitches, catalytically converted pitches, and thermoset or thermoplastic resins, such as phenolic resins. In some examples, the carbon-carbon composite preform may be subjected to a sufficient number of densification steps to result in a density between about 1.5 grams per cubic centimeter (g/cm$^3$) and about 1.85 g/cm$^3$ or higher.

In some examples of RTM, the carbon-carbon composite preform is placed into a mold matching the desired part geometry. A relatively low viscosity thermoset resin may be injected at low temperature (50° C. to 150° C.) using pressure or induced under vacuum, into the porous carbon-carbon composite preform contained within a mold. The resin is cured within the mold before being removed from the mold.

In one example of an RTM process, the densifying agent, such as a resin or pitch, may be rapidly injected into a mold enclosing the porous preform, e.g., within between about 10 seconds and about 40 seconds, such as about between about 15 seconds and about 40 seconds, using an injection apparatus. In one example, the injection apparatus may comprise a heater extruder that melts a densifying agent feedstock, such as resin pellets, and feeds the liquid densifying agent to an accumulator. An injector, such as a piston, may drive the liquid densifying agent into the mold at a relatively high pressure and at a relatively high velocity. Further description of an example injection apparatus and method of using the apparatus is described in the commonly-assigned U.S. Pat. Nos. 6,537,470 and 7,172,408, the entire contents of which are incorporated herein by reference.

In some examples of VPI, the carbon-carbon composite preform is heated under inert conditions to well above the melting point of the impregnating pitch. Then, gas in the pores of the carbon-carbon composite preform is removed by evacuating the preform. Finally, molten pitch is allowed to infiltrate the pores of the preform, as the overall pressure is returned to one atmosphere or above. In the VPI process, a volume of resin or pitch is melted in one vessel while the porous carbon-carbon composite preform is contained in a second vessel under vacuum. The molten resin or pitch is transferred from vessel one into the porous preforms contained in the second vessel using a combination of vacuum and pressure. The VPI process typically employs resin and pitches which possess low to medium viscosity. Such pitches may provide lower carbon yields than mesophase pitches.

After injecting the densifying agent into the porous preform, the densifying agent may be pyrolyzed to remove any non-carbon containing elements, which may convert the densifying agent infiltrated within the porous preform into a carbon-carbon composite. In one example, where a synthetic mesophase pitch is used, the pitch may be pyrolyzed using hot isostatic pressurization (HIP). In another example, the densifying agent may be stabilized by heating the densifying agent infiltrated in the porous preform in an oxygen-containing environment to a temperature below the softening point of the densifying agent. The oxygen may react with the densifying agent to provide for cross-linking within the densifying agent. Once a suitable amount of oxygen has been absorbed and/or reacted into the densifying pitch, the porous preform may be heated to pyrolysis temperatures without melting the densifying agent or exuding any of the densifying agent from the porous preform.

When the densifying agent is pyrolyzed, the densifying agent may form anisotropic carbon. Although the densifying agent may be a medium-to-high yielding carbon precursor, the resulting anisotropic carbon may still have some porosity. In some examples, the porosity may depend on the type of densifying agent, e.g., the type of carbon or resin. In some examples, at least some of the pores of the anisotropic carbon are open, e.g., in which at least some of the adjacent pores are connected.

In some examples, additional densification steps may be performed after any RTM, VPI, or PIC densification steps to achieve a final density for carbon-carbon composite 10. For example, a liquid densifying agent with a relatively low viscosity, such as a furfuryl alcohol may be infiltrated into pores remaining in the densified preform to at least partially fill the remaining pores. As another example, one or more cycles of CVD/CVI may be performed to at least partially fill the remaining pores in the densified preform.

In some examples, as shown in FIG. 1, carbon-carbon composite 10 may have a generally disc-shaped geometry, e.g., for use as a brake disc. Carbon-carbon composite 10 includes a carbon-carbon composite substrate 12 with a central bore 14 extending through an axial thickness of carbon-carbon composite substrate 12. In some examples, carbon-carbon composite substrate 12 has an inner diameter ID at bore 14, an outer diameter OD at an outer circumferential surface 16, and an axial thickness T, which is measured in a direction substantially orthogonal to the direction in which inner diameter ID and outer diameter OD are measured. In other examples, carbon-carbon composite 10 may define a different geometry.

Carbon-carbon composite 10 includes hydrophobic coating 18 on outer circumferential surface 16 of carbon-carbon composite substrate 12. As used herein, a coating is hydrophobic if it exhibits a contact angle with water of between 90 degrees and 180 degrees. Hydrophobic coating 18 may include an oxide of a metal, wherein the metal has a Pauling electronegativity of less than about 1.7 Example metals with a Pauling electronegativity of less than about 1.7 include scandium (Sc), yttrium (Y), titanium (Ti), zirconium (Zr), hafnium (Hf), vanadium (V), niobium (Nb), tantalum (Ta), chromium (Cr), manganese (Mn), zinc (Zn), cadmium (Cd), aluminum (Al), and thallium (Tl).

In some examples, the metal may be a transition metal, which includes Sc, Y, Ti, Zr, Hf, V, Nb, Ta, Cr, Mn, and Zn. Hence, the oxide of the metal may in some examples be referred to as a transition metal oxide.

In addition to having a Pauling electronegativity of less than about 1.7, the metal and its oxide may not promote oxidation of carbon-carbon composite substrate 12. In other words, the metal and the oxide of the metal in hydrophobic coating 18 may not catalyze oxidation of carbon in carbon-carbon composite substrate 12. For example, some rare earth oxides may catalyze carbon oxidation. Hence, the constraint of not promoting oxidation of carbon may reduce the number of metals whose oxide may be used in hydrophobic coating 18. In some examples, the metal includes at least one of Y, Sc, or Zr, each of which has a Pauling electronegativity of less than 1.7 and does not catalyze carbon oxidation.

In some examples, carbon-carbon composite 10 may be subjected to high temperatures during use. For example, carbon-carbon composite brake discs may be subject to temperatures as high as about 1,000° C. during braking events. Hence, in some examples, the oxide of the metal in hydrophobic coating 18 may be stable at temperatures of up to about 1,000° C. In this context, "stable" may mean at least one of does not degrade into its constituent elements, does not react with carbon, or does not react with other elements or compounds present in the environment in which hydrophobic coating 18 is used. For example, the standard free energy of formation of the oxide of the metal in hydrophobic coating 18 is less than the standard free energy of formation of carbon monoxide at all temperatures below 1,000° C. Oxides of Y, Sc, and Zr may be stable at temperatures of up to about 1,000° C.

In some examples, hydrophobic coating 18 may include a majority of the oxide of the metal having a Pauling electronegativity of less than about 1.7 (by weight). For example, hydrophobic coating 18 may include a majority of an oxide of a transition metal, or a majority of a transition metal oxide that does not promote oxidation of carbon, or a majority of a transition metal oxide that does not promote oxidation of carbon and is stable at temperatures up to about 1,000° C., or a majority of an oxide of at least one of Y, Sc, or Zr.

In some examples, hydrophobic coating 18 consists essentially of the oxide of the metal having a Pauling electronegativity of less than about 1.7. For example, hydrophobic coating 18 may consist essentially of a majority of an oxide of a transition metal, or a transition metal oxide that does not promote oxidation of carbon, or a transition metal oxide that does not promote oxidation of carbon and is stable at temperatures up to about 1,000° C., or an oxide of at least one of Y, Sc, or Zr. Novel and basic characteristics of hydrophobic coating 18 may include one or more of being hydrophobic, not catalyzing oxidation of carbon, or being stable at temperatures of up to about 1,000° C.

In some examples, hydrophobic coating 18 may exclude elements and compounds that are hydrophilic, elements and compounds that catalyze oxidation of carbon, and/or elements or compounds that are not stable at temperatures up to about 1,000° C. By excluding such elements or compounds, hydrophobic coating 18 may possess the characteristics described herein.

In this way, hydrophobic coating 18, which includes an oxide of a metal having a Pauling electronegativity of less than about 1.7, may reduce or substantially eliminate absorption, by substrate 12, of water and water-based solutions including alkali metal or alkaline earth carboxylate salts, the hydrophobic coating described herein may protect carbon-carbon composite substrate 12 from catalytic oxidation due to alkali metal or alkaline earth carboxylate salts, among other advantages.

Figure 2:
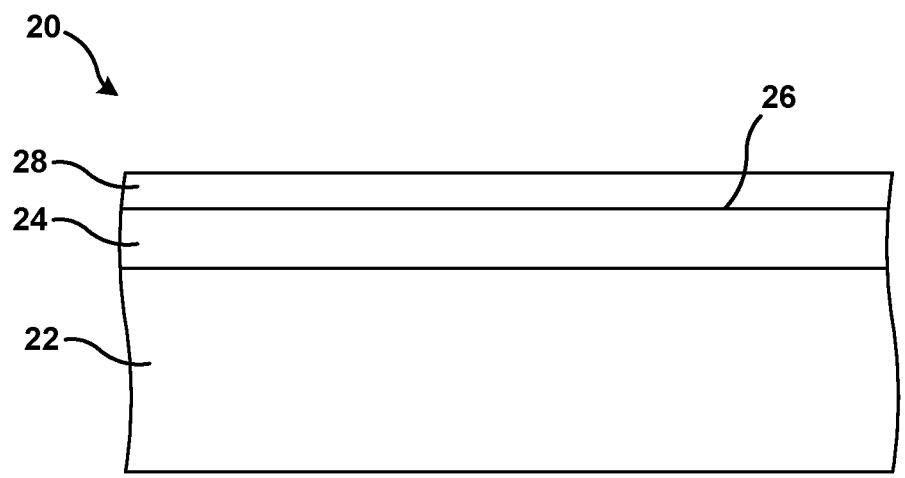
FIG. 2 is a conceptual and schematic cross-sectional of an example carbon-carbon composite that includes a hydrophobic coating and a sub-surface region including an antioxidant.

In some examples, a carbon-carbon composite additionally may include a sub-surface region that includes an antioxidant. FIG. 2 is a conceptual and schematic cross-sectional of an example carbon-carbon composite 20 that includes a hydrophobic coating 28 and a sub-surface region 24 including an antioxidant. Carbon-carbon composite 20 also includes a carbon-carbon composite substrate 22. In some examples, carbon-carbon composite substrate 22 may be similar to or substantially the same as carbon-carbon composite substrate 12 described with reference to FIG. 1. Similarly, in some examples, hydrophobic coating 28 may be similar to or substantially the same as hydrophobic coating 18 described with reference to FIG. 1.

Carbon-carbon composite 20 includes a sub-surface region 24 that includes an antioxidant. Sub-surface region 24 is below outer surface 26 of carbon-carbon composite substrate 22, and may be formed by impregnating the antioxidant or a solution including the antioxidant into outer surface 26. The antioxidant or the solution including the antioxidant may absorb into pores of carbon-carbon composite substrate 22 during the impregnation process.

In some examples, carbon-carbon composite 20 may be a carbon-carbon composite brake disc, and outer surface 26 may be a non-friction surface of the carbon-carbon composite brake disc. For example, outer surface 26 may correspond to outer circumferential surface 16 of carbon-carbon composite 10 of FIG. 1, an inner circumferential surface of carbon-carbon composite 10 of FIG. 1, or the like.

In some examples, the antioxidant may include a phosphate-based antioxidant. A phosphate-based antioxidant may include aluminum oxide mixed with phosphoric acid. Upon heating, the aluminum oxide and phosphoric acid may form an aluminum metaphosphate structure. In some examples, the phosphate-based antioxidant may include other elements, such as boron (B) or zinc (Zn), elements that promote glass formation, such as potassium (K), or the like. Some example phosphate-based antioxidants may include between about 10 weight percent (wt. %) and about 80 wt. % $H_2O$, between about 20 and about 70 wt. % $H_3PO_4$, between about 0 wt. % and about 25 wt. % $MnHPO_4 \cdot 1.6H_2O$, between about 0 wt. % and about 30 wt. % $Al(H_2PO_4)_3$, between about 0 wt. % and about 2 wt. % $B_2O_3$, between about 0 wt. % and about 10 wt. % $Zn_3(PO_4)_2$ and between about 0.1 wt. % 25 wt. % alkali metal mono-, di-, or tri-basic phosphate, where at least one of $Al(H_2PO_4)_3$, $MnHPO_4 \cdot 1.6H_2O$, or $Zn_3(PO_4)_2$ is present. The alkali metal mono-, di-, or tri-basic phosphate may include $NaH_2PO_4$, $KH_2PO_4$ or mixtures thereof. The above formulations can be formed with other salts. Also, a mixture of alkali metal hydroxide and phosphoric acid, in the proper stoichiometry, will form alkali metal mono-, di-, or tri-basic phosphate in solution. Table 1 presents example phosphate-based antioxidant formulations.

TABLE 1

| Example | $H_2O$ (Wt. %) | $H_3PO_4$, 85% (Wt. %) | $MnHPO_4 \cdot 1.6$ $H_2O$ (Wt. %) | $Al(H_2PO_4)_2$ 50% (Wt. %) | $B_2O_3$ (Wt. %) | $Zn_3(PO_4)_2$ (Wt. %) |
|---|---|---|---|---|---|---|
| 1 | 22.0 | 36.8 | 5.7 | 26.8 | 1.8 | 6.9 |
| 2 | 27.7 | 46.3 | 3.6 | 16.9 | 1.1 | 4.3 |
| 3 | 29.6 | 49.5 | 2.9 | 13.6 | 0.9 | 3.5 |
| 4 | 31.9 | 53.2 | 2.1 | 9.7 | 0.6 | 2.5 |
| 5 | 30.1 | 50.3 | — | 18.4 | 1.2 | — |
| 6 | 37.0 | 61.9 | — | — | — | 1.1 |
| 7 | 32.6 | 54.4 | 13.0 | — | — | — |

In other examples, the antioxidant may include another phosphate-based antioxidant. In general, any phosphate-based antioxidant may be used in sub-surface region 24.

The phosphate-based antioxidant may provide resistance to thermal oxidation to the carbon-carbon composite material. For example, the phosphate-based antioxidant may poison active lattice sites on the carbon lattice to reduce reactivity of the poisoned lattice sites with oxidants. As another example, the phosphate-based antioxidant may block at least some pores in the carbon, which may reduce gas transport of oxidants into the carbon-carbon composite material. In this way, by including both hydrophobic coating 28 and sub-surface region 24 including an antioxidant, carbon-carbon composite 20 may be protected from thermal oxidation by the antioxidant and catalytic oxidation by hydrophobic coating 28. In some examples, in addition to being in sub-surface region 24, the antioxidant may form a surface layer on outer circumferential surface 16 of carbon-carbon composite 20, and hydrophobic coating 28 may be on the surface layer of antioxidant.

Figure 3:
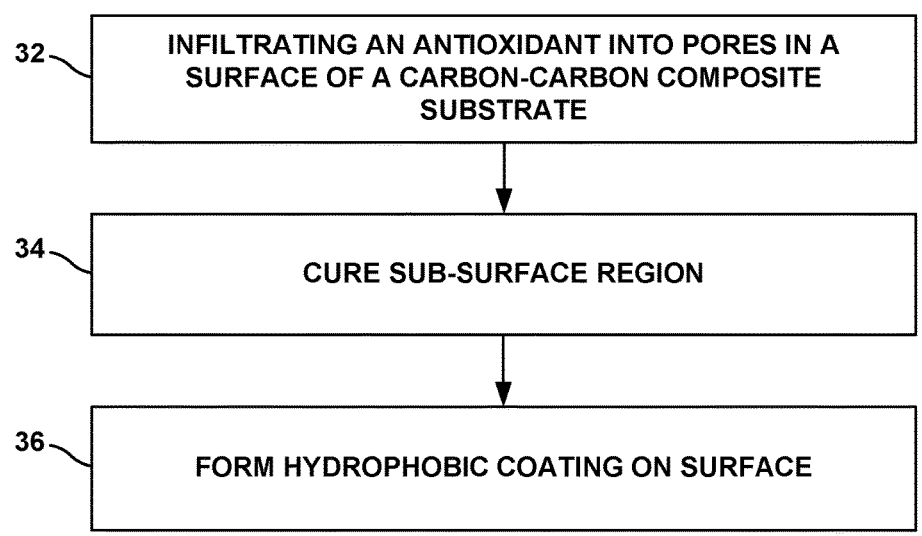
FIG. 3 is diagram illustrating an example technique for forming a carbon-carbon composite that includes a hydrophobic coating including at least one metal oxide.

FIG. 3 is diagram illustrating an example technique for forming a carbon-carbon composite that includes a hydrophobic coating including at least one metal oxide. The technique of FIG. 3 will be described with respect to carbon-carbon composite 20 of FIG. 2 for purposes of illustration only. In other examples, the technique of FIG. 3 may be used to form other carbon-carbon composites, such as carbon-carbon composite 10 of FIG. 1, carbon-carbon composite 20 of FIG. 2 may be formed using a different technique, or both.

The technique of FIG. 3 optionally includes infiltrating an antioxidant into pores in a surface 26 of a carbon-carbon composite substrate 22 (32). In some examples in which the antioxidant is a phosphate-based antioxidant, infiltrating an antioxidant into pores in a surface 26 of a carbon-carbon composite substrate 22 (32) may include treating surface 26 of carbon-carbon composite substrate 22 with a penetrant solution or sol comprising any phosphate-based antioxidant. Surface 26 may be infiltrated with the penetrant solution by brush painting, dipping, spraying, or another painting technique.

The penetrant solution may additionally and optionally contain an amount of a compatible wetting agent selected from the group consisting of polyols, alkoxylated monohydric alcohols, and silicone surfactant. The penetrant solution may include between about 0.3 wt. % and about 3 wt. %, or between about 0.5 wt. % and about 2 wt. %, or between about 0.75 wt. % and about 1.5 wt. % of the wetting agent. In some examples, the penetrant solution may include between about 0.5 wt. % and about 1 wt. % of the wetting agent.

After infiltrating the antioxidant into pores in a surface 26 of a carbon-carbon composite substrate 22 (32), sub-surface region 24 may optionally be cured (34). In some examples, sub-surface region 24 may optionally be cured at a temperature of between about 500° C. and about 900° C. In some examples, curing the sub-surface region 24 may include raising the temperature of carbon-carbon composite substrate 22 from room temperature to the curing temperature at a rate of 100° C. per hour and maintaining carbon-carbon composite substrate 22 at the curing temperature for about two hours. The curing may be performed in an inert atmosphere, such as at least one of nitrogen, argon, or helium. Curing may dehydrate the phosphoric acid, may liberate excess $P_2O_5$ in the precursor sol. In some examples, surface 26 may be treated with one to three applications of the penetrant solution, and each step may optionally be followed the curing process (34).

After the optional infiltrating (32) and curing (34) steps to form sub-surface region 24 including the antioxidant, the technique of FIG. 3 may include forming hydrophobic coating 28 on surface 26 of carbon-carbon composite substrate 22 (36). In some examples, forming hydrophobic coating 28 on surface 26 (36) may include forming a solution or sol including the metal oxide or a metal oxide precursor, then applying the solution to surface 26. For example, the solution may include a solvent, the metal oxide or the metal oxide precursor, and, optionally, one or more additives such as a dispersant, a binder, or the like. In some examples, the solvent may be a polar solvent, such as water or an alcohol such as methanol or ethanol. In examples in which the solution includes a metal oxide precursor, the metal oxide precursor may be soluble in the solvent, and may include, for example, an organic acid metal salt (such as a metal acetate), a metal nitrate, or the like.

The solution may be applied to surface 26 using any suitable technique, including, for example, spraying, brushing, dipping, rolling, or the like. Once applied, the solution may be heated to remove the solvent. In examples in which the solution includes a metal oxide precursor, the dried metal oxide precursor may be further heated in an oxidizing atmosphere to decompose the metal oxide precursor to the metal and oxidize the metal to form the metal oxide. The temperature may depend upon the metal oxide precursor. In some examples, the metal oxide precursor may be heated at a temperature of about between about 400° C. and about 700° C. for greater than about 15 minutes, such as about 500° C. for about 15 minutes to form the metal oxide.

As another example, forming hydrophobic coating 28 on surface 26 (36) may utilize a sol-gel technique. In a sol-gel technique, a metal alkoxide may be suspended in a solvent and applied to surface 26. The sol-gel mixture may be applied to surface 26 using any suitable technique, including, for example, spraying, brushing, dipping, rolling, or the like.

The metal alkoxide may include an alkoxide of the metal that is oxidized to form the metal oxide in hydrophobic coating 28. Similar to the solution process, the mixture may optionally include an additive, such as a dispersant, a binder, or the like.

After the sol-gel mixture is applied to surface 26, the mixture may be dried to remove the solvent. As the solvent is removed, the metal alkoxide forms a networked gel. The gel then may be further heated to form the metal oxide. In some examples, a sol-gel technique may increase the amount of the metal oxide formed in a single coating application, e.g., compared to using a solution.

Various examples have been described. These and other examples are within the scope of the following claims.

What is claimed is:

1. An article comprising:
    a carbon-carbon composite brake disk defining a friction surface and a non-friction surface, wherein the non-friction surface comprises a sub-surface region;
    a phosphate-based antioxidant in pores in the sub-surface region of the non-friction surface of the carbon-carbon composite brake disk; and
    a hydrophobic coating on the non-friction surface of the carbon-carbon composite brake disk, the hydrophobic coating comprising a majority by weight of an oxide of a first metal, wherein the first metal has a Pauling electronegativity of less than about 1.7, and wherein the hydrophobic coating excludes oxides of second metals, the second metals having a Pauling electronegativity of greater than 1.7.

2. The article of claim 1, wherein the hydrophobic coating consists essentially of the oxide of the first metal having the Pauling electronegativity of less than about 1.7.

3. The article of claim 1, wherein the oxide of the first metal has a standard free energy of formation that is less than the standard free energy of formation of carbon monoxide at all temperatures below 1000° C.

4. The article of claim 1, wherein the first metal comprises at least one of Y, Sc, or Zr.

5. The article of claim 1, wherein the first metal is Y.

6. The article of claim 1, wherein the first metal and the oxide of the first metal do not promote oxidation of the carbon.

7. A method of forming the article of claim 1, the method comprising:
    infiltrating the phosphate-based antioxidant into pores in the sub-surface region of the non-friction surface of the carbon-carbon composite brake disk, wherein the carbon-carbon composite brake disk defines the non-friction surface and the friction surface; and
    forming the hydrophobic coating on the non-friction surface of the carbon-carbon composite brake disk over the sub-surface region, wherein the hydrophobic coating comprises a majority by weight of the oxide of the first metal, wherein the first metal has a Pauling electronegativity of less than about 1.7, and wherein the hydrophobic coating excludes oxides of second metals, the second metals having a Pauling electronegativity of greater than 1.7.

8. The method of claim 7, wherein forming the hydrophobic coating comprises applying a solution or slurry comprising a solvent and the oxide of the first metal or the solvent and a precursor of the oxide of the first metal to the non-friction surface of the carbon-carbon composite brake disk to form a coated carbon-carbon composite brake disk.

9. The method of claim 8, further comprising:
    heating the coated carbon-carbon composite brake disk to evaporate substantially all of the solvent and form a dried carbon-carbon composite brake disk.

10. The method of claim 9, wherein the solution or slurry comprising the oxide of the first metal or the precursor of the oxide of the first metal and the solvent comprises a solution comprising a salt precursor of the oxide of the first metal and the solvent, the method further comprising:
    heating the dried carbon-carbon composite at a temperature that facilitates decomposition of the salt precursor of the oxide of the first metal to the oxide of the first metal.

11. The method of claim 7, wherein forming the hydrophobic coating comprises applying the hydrophobic coating using sol-gel processing or from a colloidal suspension.

12. A carbon-carbon composite brake disk comprising:
    a carbon-carbon composite substrate defining a friction surface and a non-friction surface;
    a phosphate-based antioxidant in pores in a sub-surface region below the non-friction surface; and
    a hydrophobic coating on the non-friction surface over the phosphate-based antioxidant, wherein the hydrophobic coating comprises a majority by weight of at least one of yttrium oxide, scandium oxide, or zirconium oxide, and wherein the hydrophobic coating excludes metal oxides of metals that have a Pauling electronegativity of greater than 1.7.

13. The carbon-carbon composite brake disk of claim 12, wherein the hydrophobic coating consists essentially of the at least one of yttrium oxide, scandium oxide, or zirconium oxide.

14. The carbon-carbon composite brake disk of claim 12, wherein the hydrophobic coating is substantially free of materials that catalyze carbon oxidation.

* * * * *